United States Patent
Wang et al.

(10) Patent No.: US 10,593,245 B2
(45) Date of Patent: Mar. 17, 2020

(54) SHIFT REGISTER, GATE DRIVING CIRCUIT, DISPLAY PANEL AND DRIVING METHOD

(71) Applicants: BOE Technology Group Co., Ltd., Beijing (CN); Hefei Xinsheng Optoelectronics Technology Co., Ltd., Hefei (CN)

(72) Inventors: Zixuan Wang, Beijing (CN); Fei Wang, Beijing (CN); Yuting Chen, Beijing (CN)

(73) Assignees: BOE Technology Group Co., Ltd., Beijing (CN); Hefei Xinsheng Optoelectronics Technology Co., Ltd., Hefei (CN)

( * ) Notice: Subject to any disclaimer, the term of this patent is extended or adjusted under 35 U.S.C. 154(b) by 0 days.

(21) Appl. No.: 15/761,749
(22) PCT Filed: Sep. 20, 2017
(86) PCT No.: PCT/CN2017/102448
§ 371 (c)(1),
(2) Date: Mar. 20, 2018
(87) PCT Pub. No.: WO2018/161523
PCT Pub. Date: Sep. 13, 2018

(65) Prior Publication Data
US 2019/0066559 A1 Feb. 28, 2019

(30) Foreign Application Priority Data
Mar. 8, 2017 (CN) .......................... 2017 1 0135056

(51) Int. Cl.
*G11C 19/28* (2006.01)
*G09G 3/36* (2006.01)
(Continued)

(52) U.S. Cl.
CPC ............. *G09G 3/20* (2013.01); *G09G 3/3266* (2013.01); *G09G 3/3677* (2013.01); *G11C 19/28* (2013.01);
(Continued)

(58) Field of Classification Search
CPC ...... G09G 3/20; G09G 3/3266; G09G 3/3674; G09G 3/3677; G09G 2300/0408; G09G 2310/0267; G09G 2310/0286; G11C 19/28

See application file for complete search history.

(56) References Cited

U.S. PATENT DOCUMENTS 8,344,991 B2 * 1/2013 Hwang ................ G09G 3/3677
345/100
9,530,370 B2 * 12/2016 Yang .................... G09G 3/3677
(Continued)

FOREIGN PATENT DOCUMENTS

| CN | 103218962 A | 7/2013 |
| CN | 103258495 A | 8/2013 |

(Continued)

OTHER PUBLICATIONS

Dec. 1, 2017—(WO) International Search Report and Written Opinion Appn PCT/CN2017/102448 with English Tran.

*Primary Examiner* — Patrick O Neill
(74) *Attorney, Agent, or Firm* — Banner & Witcoff, Ltd.

(57) ABSTRACT

A shift register, a gate driving circuit, a display panel and a driving method. The shift register includes: an input circuit, connected with a pull-up node and an input signal terminal respectively; a reset circuit, connected with the pull-up node, a reset signal terminal and a first power terminal respectively to receive a first power voltage; an output circuit, connected with the pull-up node, a clock signal terminal and an output terminal respectively; and an output pull-down circuit, connected with the output terminal and configured to write a second power voltage to the output terminal, where the first power voltage is different from the second power voltage.

8 Claims, 8 Drawing Sheets

(51) Int. Cl.
*G09G 3/20* (2006.01)
*G09G 3/3266* (2016.01)

(52) U.S. Cl.
CPC ............ *G09G 2300/0408* (2013.01); *G09G 2310/0267* (2013.01); *G09G 2310/0286* (2013.01)

(56) References Cited

U.S. PATENT DOCUMENTS

| | | | |
|---|---|---|---|
| 9,824,659 B2 * | 11/2017 | Gu ........................ | G06F 3/0412 |
| 9,940,889 B2 * | 4/2018 | Park ..................... | G09G 3/3677 |
| 9,984,642 B2 * | 5/2018 | Lv .......................... | G09G 3/36 |
| 10,170,069 B2 * | 1/2019 | Xue ..................... | G09G 3/3677 |
| 10,217,391 B2 * | 2/2019 | Shang .................. | G11C 19/287 |
| 10,222,904 B2 * | 3/2019 | Gu ........................ | G11C 19/28 |
| 2015/0002504 A1 * | 1/2015 | Jo ........................ | G09G 3/3677 |
| | | | 345/213 |
| 2015/0228353 A1 | 8/2015 | Qing et al. | |
| 2017/0270851 A1 | 9/2017 | Shang et al. | |
| 2018/0301075 A1 * | 10/2018 | Zhou ..................... | G09G 3/20 |
| 2018/0342187 A1 * | 11/2018 | Shan ..................... | G09G 3/20 |

FOREIGN PATENT DOCUMENTS

| | | |
|---|---|---|
| CN | 103440839 A | 12/2013 |
| CN | 105185349 A | 12/2015 |
| CN | 106448532 A | 2/2017 |
| CN | 106611582 A | 5/2017 |

* cited by examiner

SHIFT REGISTER, GATE DRIVING CIRCUIT, DISPLAY PANEL AND DRIVING METHOD

The application is a U.S. National Phase Entry of International Application No. PCT/CN2017/102448 filed on Sep. 20, 2017, designating the United States of America and claiming priority to Chinese Patent Application No. 201710135056.1, filed Mar. 8, 2017. The present application claims priority to and the benefit of the above-identified applications and the above-identified applications are incorporated by reference herein in their entirety.

TECHNICAL FIELD

Embodiments of the present disclosure relate to a shift register, a gate driving circuit, a display panel and a driving method.

BACKGROUND

With the rapid development of display technology, display panels are increasingly developed toward a direction of high integration and low cost. A gate-driver on array (GOA) substrate technology is a technology of directly integrating a gate driving circuit on an array substrate of a display device through a photolithography process. A GOA circuit typically includes a plurality of cascaded shift registers, each shift register is connected to a gate line corresponding to a row or a column of pixels (for example, each shift register provides a scan driving signal to a gate line) to achieve scan driving of a display panel. This integrated technology can save spaces of a bonding area and a fan-out area of a gate integrated circuit, so as to achieve a narrow frame of the display panel, and meanwhile, produce costs can be reduced and produce yields can be improved.

Reliability of a GOA directly affects reliability of the display panel, and therefore, how to improve the reliability of the GOA has also become one of the research focuses.

SUMMARY

An embodiment of the present disclosure provides a shift register, which comprises: an input circuit, connected with a pull-up node and an input signal terminal respectively; a reset circuit, connected with the pull-up node, a reset signal terminal and a first power terminal to receive a first power voltage respectively; an output circuit, connected with the pull-up node, a clock signal terminal and an output terminal respectively; and an output pull-down circuit, connected with the output terminal and configured to write a second power voltage to the output terminal, the first power voltage being different from the second power voltage.

For example, in the shift register provided by an embodiment of the present disclosure, the output circuit comprises a storage capacitor and a first transistor, a first electrode of the first transistor is connected with the clock signal terminal, a control electrode of the first transistor is connected with the pull-up node, a second electrode of the first transistor is connected with the output terminal, a first terminal of the storage capacitor is connected with the pull-up node, and a second terminal of the storage capacitor is connected with the output terminal.

For example, in the shift register provided by an embodiment of the present disclosure, the input circuit comprises a second transistor, a first electrode of the second transistor is connected with the input signal terminal, a control electrode of the second transistor is connected with the input signal terminal, a second electrode of the second transistor is connected with the pull-up node; the reset circuit comprises a third transistor, a first electrode of the third transistor is connected with the pull-up node, a control electrode of the third transistor is connected with the reset signal terminal, and a second electrode of the third transistor is connected with the first power terminal.

For example, in the shift register provided by an embodiment of the present disclosure, the output pull-down circuit comprises a first output pull-down transistor, a first electrode of the first output pull-down transistor is connected with the output terminal, a control electrode of the first output pull-down transistor is connected with the reset signal terminal, and a second electrode of the first output pull-down transistor is connected with a second power terminal to receive the second power voltage.

For example, the shift register provided by an embodiment of the present disclosure further comprises a first pull-down control circuit, the output pull-down circuit comprises a first output pull-down transistor, a first electrode of the first output pull-down transistor is connected with the output terminal, a control electrode of the first output pull-down transistor is connected with the first pull-down control circuit, a second electrode of the first output pull-down transistor is configured to receive the second power voltage; and the first pull-down control circuit is configured to control turning-on and turning-off of the first output pull-down transistor.

For example, in the shift register provided by an embodiment of the present disclosure, the first pull-down control circuit comprises a first sub-control circuit and a second sub-control circuit, the first sub-control circuit is connected with a third power terminal, a first pull-down node and the second sub-control circuit respectively, and the second sub-control circuit is connected with the pull-up node, the first pull-down node and the first power terminal respectively.

For example, in the shift register provided by an embodiment of the present disclosure, the first sub-control circuit comprises a first control transistor and a second control transistor, and the second sub-control circuit comprises a thirdcontrol transistor and a fourth control transistor; the control electrode of the first output pull-down transistor is connected with the first pull-down node; a first electrode of the first control transistor is connected with the third power terminal, a control electrode of the first control transistor is connected with the third power terminal, a second electrode of the first control transistor is connected with a first node; a first electrode of the second control transistor is connected with the third power terminal, a control electrode of the second control transistor is connected with the first node, a second electrode of the second control transistor is connected with the first pull-down node; a first electrode of the third control transistor is connected with the first pull-down node, a control electrode of the third control transistor is connected with the pull-up node, a second electrode of the third control transistor is connected with the first power terminal; a first electrode of the fourth control transistor is connected with the first node, a control electrode of the fourth control transistor is connected with the pull-up node, and a second electrode of the fourth control transistor is connected with the first power terminal.

For example, the shift register provided by an embodiment of the present disclosure further comprises a second pull-down control circuit, the output pull-down circuit further comprises a second output pull-down transistor, a first electrode of the second output pull-down transistor is connected with the output terminal, a control electrode of the second output pull-down transistor is connected with the second pull-down control circuit, a second electrode of the second output pull-down transistor is configured to receive the second power voltage; and the second pull-down control circuit is configured to control turning-on and turning-off of the second output pull-down transistor.

For example, in the shift register provided by an embodiment of the present disclosure, the first sub-control circuit comprises a first control transistor and a second control transistor, and the second pull-down control circuit comprises a third sub-control circuit and a fourth sub-control circuit; the first sub-control circuit is connected with a first power signal terminal, a first pull-down node and the second sub-control circuit respectively; the second sub-control circuit is connected with the pull-up node, the first pull-down node and the first power terminal respectively; the third sub-control circuit is connected with a second power signal terminal, a second pull-down node and the fourth sub-control circuit respectively; and the fourth sub-control circuit is connected with the pull-up node, the second pull-down node and the first power terminal respectively.

For example, in the shift register provided by an embodiment of the present disclosure, the first sub-control circuit comprises a first control transistor and a second control transistor, the second sub-control circuit comprises a third control transistor and a fourth control transistor, the third sub-control circuit comprises a fifth control transistor and a sixth control transistor, and the fourth sub-control circuit comprises a seventh control transistor and an eighth control transistor; the control electrode of the first output pull-down transistor is connected with the first pull-down node, and the second electrode of the first output pull-down transistor is connected with the second power signal terminal to receive a second power signal; a first electrode of the first control transistor is connected with the first power signal terminal to receive a first power signal, a control electrode of the first control transistor is connected with the first power signal terminal to receive the first power signal, and a second electrode of the first control transistor is connected with a first node; a first electrode of the second control transistor is connected with the first power signal terminal to receive the first power signal, a control electrode of the second control transistor is connected with the first node, and a second electrode of the second control transistor is connected with the first pull-down node; a first electrode of the third control transistor is connected with the first pull-down node, a control electrode of the third control transistor is connected with the pull-up node, and a second electrode of the third control transistor is connected with the first power terminal to receive the first power voltage; a first electrode of the fourth control transistor is connected with the first node, a control electrode of the fourth control transistor is connected with the pull-up node, and a second electrode of the fourth control transistor is connected with the first power terminal to receive the first power voltage; the control electrode of the second output pull-down transistor is connected with the second pull-down node, and the second electrode of the second output pull-down transistor is connected with the first power signal terminal to receive the first power signal; a first electrode of the fifth control transistor is connected with the second power signal terminal to receive the second power signal, a control electrode of the fifth control transistor is connected with the second power signal terminal to receive the second power signal, and a second electrode of the fifth control transistor is connected with a second node; a first electrode of the sixth control transistor is connected with the second power signal terminal to receive the second power signal, a control electrode of the sixth control transistor is connected with the second node, and a second electrode of the sixth control transistor is connected with the second pull-down node; a first electrode of the seventh control transistor is connected with the second pull-down node, a control electrode of the seventh control transistor is connected with the pull-up node, and a second electrode of the seventh control transistor is connected with the first power terminal to receive the first power voltage; a first electrode of the eighth control transistor is connected with the second node, a control electrode of the eighth control transistor is connected with the pull-up node, and a second electrode of the eighth control transistor is connected with the first power terminal to receive the first power voltage; the first power signal and the second power signal are mutually reverse signals, when the first power signal is a low-level signal, a voltage of the first power signal is the second power voltage, and when the second power signal is the low-level signal, a voltage of the second power signal is the second power voltage.

For example, the shift register provided by an embodiment of the present disclosure further comprises a pull-up node pull-down circuit, connected with the pull-up node, the first pull-down node, the second pull-down node and the first power terminal respectively.

For example, in the shift register provided by an embodiment of the present disclosure, the pull-up node pull-down circuit comprises a first pull-down transistor and a second pull-down transistor, a first electrode of the first pull-down transistor is connected with the pull-up node, a control electrode of the first pull-down transistor is connected with the second pull-down node, and a second electrode of the first pull-down transistor is connected with the first power terminal to receive the first power voltage; a first electrode of the second pull-down transistor is connected with the pull-up node, a control electrode of the second pull-down transistor is connected with the first pull-down node, and a second electrode of the second pull-down transistor is connected with the first power terminal to receive the first power voltage.

An embodiment of the present disclosure further provides a gate driving circuit, comprising a shift register provided by any one embodiment of the present disclosure.

For example, the gate driving circuit provided by an embodiment of the present disclosure comprises a plurality of cascaded shift registers provided by any one embodiment of the present disclosure. Except for a first-stage shift register and a last-stage shift register, an input signal terminal of a present-stage shift register is connected with an output terminal of a previous-stage shift register; a reset signal terminal of the present-stage shift register is connected with an output terminal of a next-stage shift register.

An embodiment of the present disclosure further provides a display panel, comprising a gate driving circuit provided by anyone embodiment of the present disclosure.

An embodiment of the present disclosure further provides a driving method of a shift register provided by anyone embodiment of the present disclosure, comprising: writing the first power voltage to the pull-up node; and writing the second power voltage to the output terminal, the first power voltage being different from the second power voltage.

BRIEF DESCRIPTION OF THE DRAWINGS

In order to clearly illustrate the technical solutions of the embodiments of the disclosure, the drawings of the embodi

DETAILED DESCRIPTION

The technical solutions of the embodiments will be described in a clearly and fully understandable way below in connection with the accompanying drawings. With reference to the non-limiting exemplary embodiments illustrated in the accompanying drawings and detailed in the following description, the exemplary embodiments of the present disclosure and their various features and advantageous details are more fully described. It should be noted that, the features shown in figures are not necessarily to be drawn in a real scale. The description of the known material(s), component(s) and process technology can be omitted in the present disclosure, so that the exemplary embodiments of the present disclosure are not obscured. The examples provided are merely intended to be beneficial for understanding the implementation of the exemplary embodiments of the present disclosure, and further enable one of ordinary skill in the art to implement the exemplary embodiments. Therefore, the examples should not be construed as a limitation of the scope of the embodiments of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. In addition, in respective embodiments of the present disclosure, the same or similar reference numerals denote the same or similar components.

Figure 1:
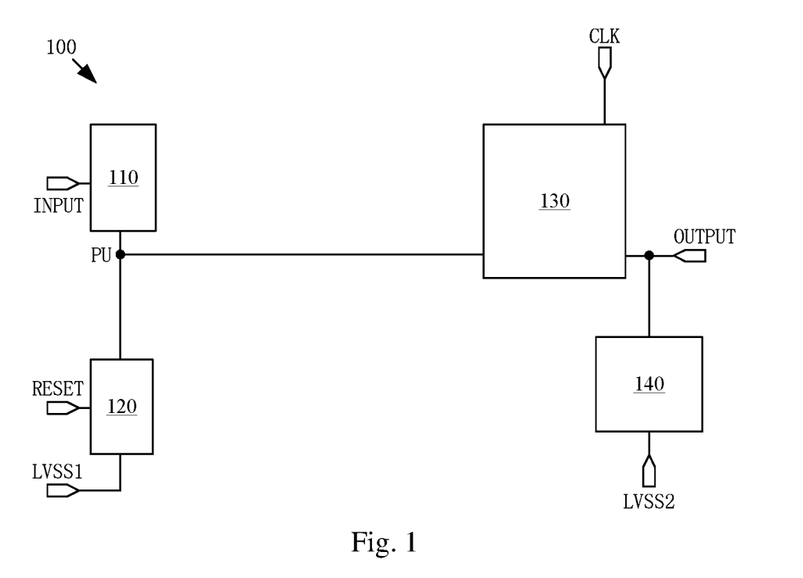
- FIG. 1 is a first schematic diagram of a shift register provided by an embodiment of the present disclosure.

An embodiment of the present disclosure provides a shift register 100. As shown in FIG. 1, the shift register 100 comprises an input circuit 110, a reset circuit 120, an output circuit 130 and an output pull-down circuit 140. The input circuit 110 is respectively connected with a pull-up node PU and an input signal terminal INPUT; the reset circuit 120 is respectively connected with the pull-up node PU, a reset signal terminal RESET and a first power terminal LVSS1, and the first power terminal LVSS1 is configured to provide a first power voltage VSS1; the output circuit 130 is respectively connected with the pull-up node PU, a clock signal terminal CLK and an output terminal OUTPUT; the output pull-down circuit 140 is connected with the output terminal OUTPUT, and the output pull-down circuit 140 is configured to write a second power voltage VSS2 to the output terminal OUTPUT. The first power voltage VSS1 is different from the second power voltage VSS2.

Figure 2:
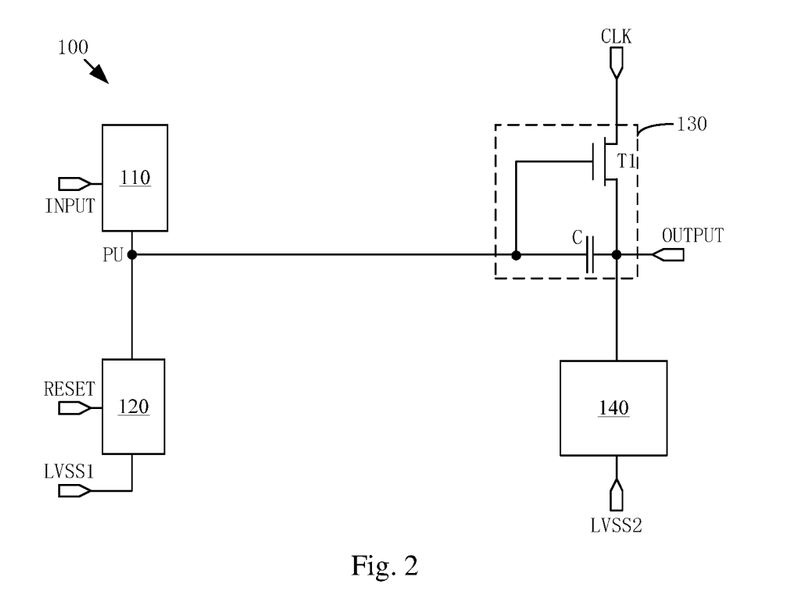
FIG. 2 is a second schematic diagram of a shift register provided by an embodiment of the present disclosure.

For example, as shown in FIG. 2, in the shift register 100 provided by an embodiment of the present disclosure, the output circuit 130 comprises a storage capacitor C and a first transistor T1. A first electrode of the first transistor T1 is connected with the clock signal terminal CLK, a control electrode of the first transistor T1 is connected with the pull-up node PU, and a second electrode of the first transistor T1 is connected with the output terminal OUTPUT. A first terminal of the storage capacitor C is connected with the pull-up node PU, and a second terminal of the storage capacitor C is connected with the output terminal OUTPUT.

For example, a control electrode of a transistor described in the embodiments of the present disclosure is a gate electrode of the transistor.

It should be noted that, transistors used in the embodiments of the present disclosure may be thin film transistors, field effect transistors or other switching devices with like characteristics. A source electrode and a drain electrode of a transistor used herein may be symmetrical in structure, so that the source electrode and the drain electrode of the transistor may have no difference in structure. In the embodiments of the present disclosure, in order to distinguish two electrodes of the transistor besides a gate electrode, one of the two electrodes is directly referred to as a first electrode, and the other of the two electrodes is referred to as a second electrode, and therefore the first electrode and the second electrode of all or part of the transistors in the embodiments of the present disclosure are interchangeable as needed. For example, the first electrode of the transistor described in the embodiments of the present disclosure may be the source electrode, and the second electrode may be the drain electrode; alternatively, the first electrode of the transistor may be the drain electrode, and the second electrode may be the source electrode. In addition, the transistors may be classified into N-type transistors and P-type transistors according to the characteristics of the transistors. When a transistor is a P-type transistor, a turn-on voltage is a low level voltage (such as, 0V, −5V, or other value), and a turn-off voltage is a high level voltage (such as, 5V, 10V, or other value); when the transistor is an N-type transistor, a turn-on voltage is a high level voltage (such as, 5V, 10V, or other value), and a turn-off voltage is a low level voltage (such as, 0V, −5V, or other value).

For example, in a case that the first transistor T1 is an N-type transistor, the first power voltage VSS1 is smaller than the second power voltage VSS2. For another example, in a case that the first transistor T1 is the N-type transistor, the first power voltage VSS1 is −11V, and the second power voltage VSS2 is −8V. The embodiments of the disclosure comprises but are not limited thereto. The first power voltage VSS1 and the second power voltage VSS2 may also be other voltage values, provided that the first power voltage VSS1 is smaller than the second power voltage VSS2.

For example, in a case that the first transistor T1 is a P-type transistor, the first power voltage VSS1 is larger than the second power voltage VSS2. For another example, in a case that the first transistor T1 is the P-type transistor, the first power voltage VSS1 is −8V, and the second power voltage VSS2 is −11V. The embodiments of the disclosure comprises but are not limited thereto. The first power voltage VSS1 and the second power voltage VSS2 may also be other voltage values, provided that the first power voltage VSS1 is larger than the second power voltage VSS2.

In some cases, when a threshold voltage of the first transistor T1 is drifted to be less than or equal to 0V, a channel of the first transistor T1 may be turned on under a gate voltage and a source voltage of the first transistor T1. That is, a threshold voltage drift of the first transistor T1 may cause the first transistor T1 to be turned on when the first transistor T1 should not be turned on, leading to occurrence of a multi-output phenomenon in the shift register. By applying different voltages to the gate electrode and the second electrode of the first transistor respectively, the shift register provided by an embodiment of the present disclosure can reduce a risk of the shift register failure caused by the threshold voltage drift of the first transistor and can increase the design redundancy of the threshold voltage drift of the first transistor.

It should be noted that, in the embodiments of the present disclosure, respective transistors are N-type transistors, which is taken as an example to describe the embodiments of the present disclosure. That is, the embodiments of the present disclosure are described by taking a case that the first power voltage VSS1 is smaller than the second power voltage VSS2 as an example. Based on the description and teaching of this implementation of the present disclosure, without any inventive work, a person of ordinary skill in the art can easily think of implementations when the embodiments of the present disclosure can adopt the N-type transistors or a combination of the N-type transistors and the P-type transistors, and therefore, theses implementations are also within the protection scope of the present disclosure.

For example, when the first transistor T1 is the N-type transistor: in a case that a gate-source voltage Vgs (namely a difference between a gate voltage and a source voltage) of the first transistor T1 is less than the threshold voltage Vth, the first transistor T1 is turned off; in a case that the gate-source voltage Vgs of the first transistor T1 is larger than the threshold voltage Vth, the first transistor T1 is turned on. Considering that a gate-drain voltage Vgd (namely a difference between the gate voltage and a drain voltage) of the first transistor T1 affects formation of a channel at a drain side during the operation of the first transistor T1, in a case that the gate-drain voltage Vgd is less than the threshold voltage Vth, the channel at the drain side disappears, and the first transistor is in a pinch-off area.

For example, in an embodiment of the present disclosure, the first electrode (such as a source electrode) of the first transistor T1 is connected with the clock signal terminal CLK, the control electrode (such as a gate electrode) of the first transistor T1 is connected with the pull-up node UP, and the second electrode (such as a drain electrode) is connected with the output terminal OUTPUT. Therefore, at a voltage holding stage (a fourth stage t4 shown in FIG. 10), the gate voltage of the first transistor T1 is the first power voltage VSS1 (such as, −11V), the drain voltage of the first transistor T1 is the second power voltage VSS2 (such as, −8V). In this case, the gate-drain voltage Vgd of the first transistor T1 is −3V, and compared with a case that the gate voltage and the drain voltage are the same (that is, Vgd=0V), the channel at a drain side of the first transistor T1 is less likely to form a sensing channel that makes the first transistor T1 be in a pinch-off state. Thus, a risk of the shift register failure due to the drift of the threshold voltage Vth of the first transistor T1 is reduced and design redundancy for the threshold voltage drift of the first transistor is increased.

Figure 3:
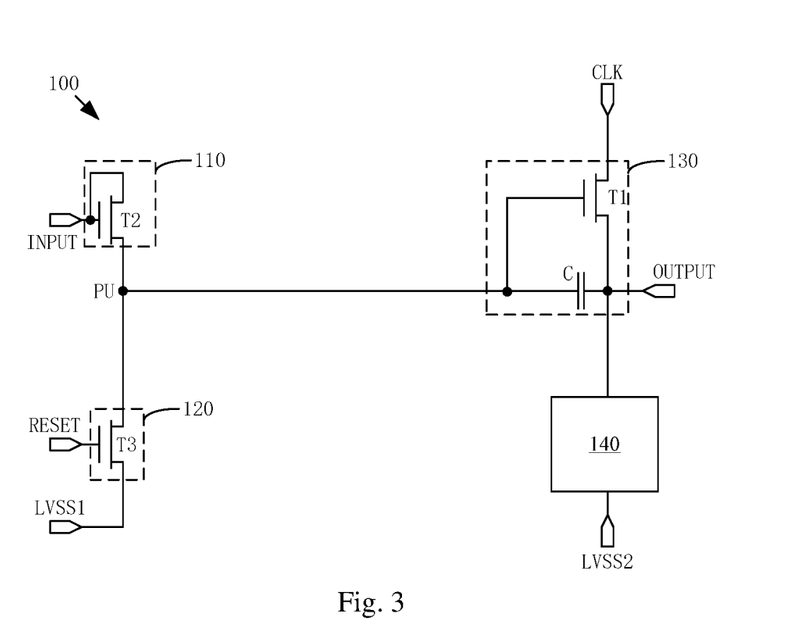
FIG. 3 is a third schematic diagram of a shift register provided by an embodiment of the present disclosure.

For example, as shown in FIG. 3, in the shift register 100 provided by an embodiment of the present disclosure, the input circuit 110 comprises a second transistor T2. A first electrode of the second transistor T2 is connected with the input signal terminal INPUT, a control electrode of the second transistor T2 is connected with the input signal terminal INPUT, and a second electrode of the second transistor T2 is connected with the pull-up node PU.

For example, as shown in FIG. 3, the reset circuit 120 comprises a third transistor T3. A first electrode of the third transistor T3 is connected with the pull-up node PU, a control electrode of the third transistor T3 is connected with the reset signal terminal RESET, and a second electrode of the third transistor T3 is connected with the first power terminal LVSS1 to receive the first power voltage VSS1. For example, when the third transistor is turned on, the first power voltage VSS1 of the first power terminal LVSS1 is transmitted to the pull-up node PU.

It should be noted that, the input circuit 110 and the reset circuit 120 shown in FIG. 3 are merely examples in the embodiments of the present disclosure. The embodiments of the present disclosure include, but are not limited to, the implementation shown in FIG. 3.

Figure 4:
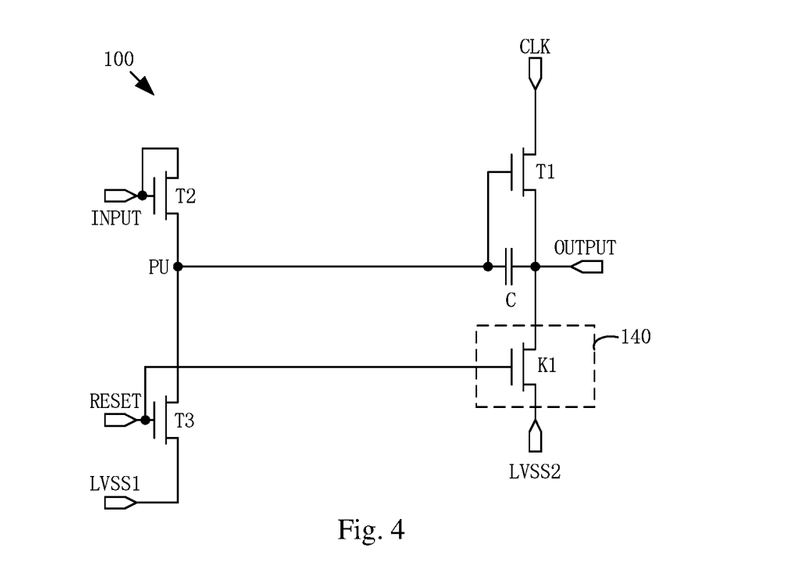
FIG. 4 is a fourth schematic diagram of a shift register provided by an embodiment of the present disclosure.

For example, as shown in FIG. 4, in the shift register 100 provided by an embodiment of the present disclosure, the output pull-down circuit 140 comprises a first output pull-down transistor K1. A first electrode of the first output pull-down transistor K1 is connected with the output terminal OUTPUT, a control electrode of the first output pull-down transistor K1 is connected with the reset signal terminal RESET, and a second electrode of the first output pull-down transistor K1 is connected with a second power terminal LVSS2 to receive the second power voltage VSS2. In the implementation shown in FIG. 4, a signal from the reset signal terminal RESET controls the turning-on and turning-off of the first output pull-down transistor K1.

Figure 5:
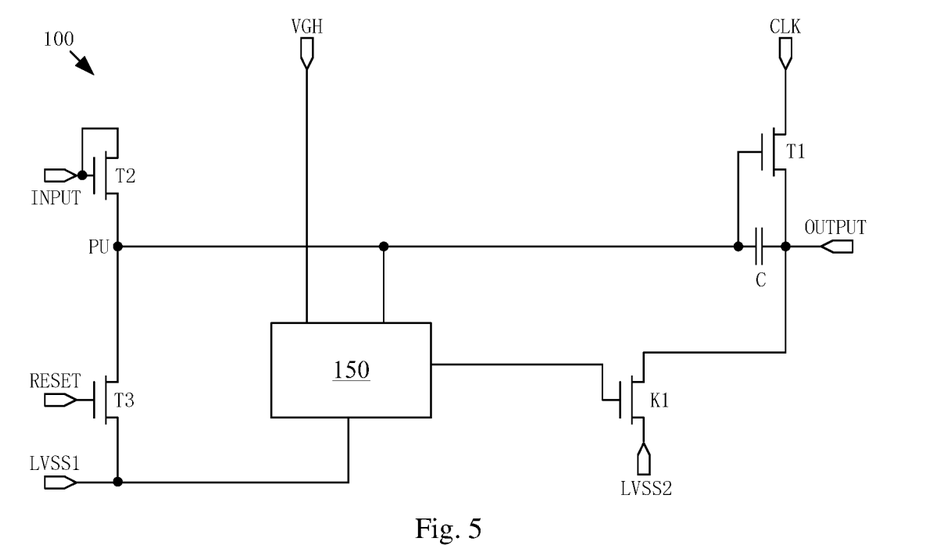
FIG. 5 is a fifth schematic diagram of a shift register provided by an embodiment of the present disclosure.

For example, as shown in FIG. 5, the shift register 100 provided by an embodiment of the present disclosure further comprises a first pull-down control circuit 150. The first electrode of the first output pull-down transistor K1 is connected with the output terminal OUTPUT, the control electrode of the first output pull-down transistor K1 is connected with the first pull-down control circuit 150, and the second electrode of the first output pull-down transistor K1 is configured to receive the second power voltage VSS2. The first pull-down control circuit 150 is configured to control to the turning-on and turning-off of the first output pull-down transistor K1. For another example, the second electrode of the first output pull-down transistor K1 is connected with the second power terminal LVSS2 to receive the second power voltage VSS2; and the first pull-down control circuit 150 is respectively connected with a third power terminal VGH, the pull-up node UP, the first power terminal LVSS1 and the control electrode (such as the gate electrode) of the first output pull-down transistor K1.

For example, the third power terminal VGH is configured to provide a third power voltage VH, and the third power voltage VH is, for example, a voltage (for example, 5V, 10V, 22V, etc.) capable of turning on an N-type transistor. The third power voltage VH is larger than the first power voltage VSS1, and the third power voltage VH is larger than the second power voltage VSS2.

Figure 6:
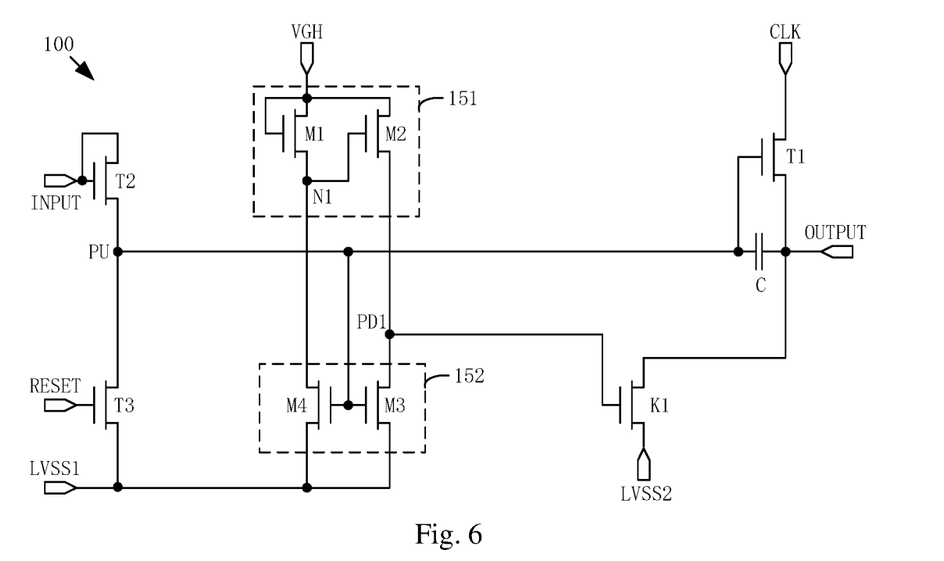
FIG. 6 is a sixth schematic diagram of a shift register provided by an embodiment of the present disclosure.

For example, as shown in FIG. 6, in the shift register 100 provided by an embodiment of the present disclosure, the first pull-down control circuit 150 comprises a first sub-control circuit 151 and a second sub-control circuit 152. The first sub-control circuit 151 is respectively connected with the third power terminal VH, a first pull-down node PD1 and the second sub-control circuit 152; and the second sub-control circuit 152 is respectively connected with the pull-up node PU, the first pull-down node PD1 and the first power terminal LVSS1.

For example, referring to FIG. 6, the first sub-control circuit 151 comprises a first control transistor M1 and a second control transistor M2; and the second sub-control circuit 152 comprises a third control transistor M3 and a fourth control transistor M4. The control electrode of the first output pull-down transistor K1 is connected with the first pull-down node PD1. A first electrode of the first control transistor M1 is connected with the third power terminal VGH, a control electrode of the first control transistor M1 is connected with the third power terminal VGH, and a second electrode of the first control transistor M1 is connected with a first node N1. A first electrode of the second control transistor M2 is connected with the third power terminal VGH, a control electrode of the second control transistor M2 is connected with the first node N1, and a second electrode of the second control transistor M2 is connected with the first pull-down node PD1. A first electrode of the third control transistor M3 is connected with the first pull-down node PD1, a control electrode of the third control transistor M3 is connected with the pull-up node PU, and a second electrode of the third control transistor M3 is connected with the first power terminal LVSS1. A first electrode of the fourth control transistor M4 is connected with the first node N1, a control electrode of the fourth control transistor M4 is connected with the pull-up node PU, and a second electrode of the fourth control transistor M4 is connected with the first power terminal LVSS1.

For example, the first sub-control circuit 151 and the second sub-control circuit 152 may cooperate with each other to adjust the voltage of the first pull-down node PD1, so as to control the turning-on and turning-off of the first output pull-down transistor K1.

Figure 7:
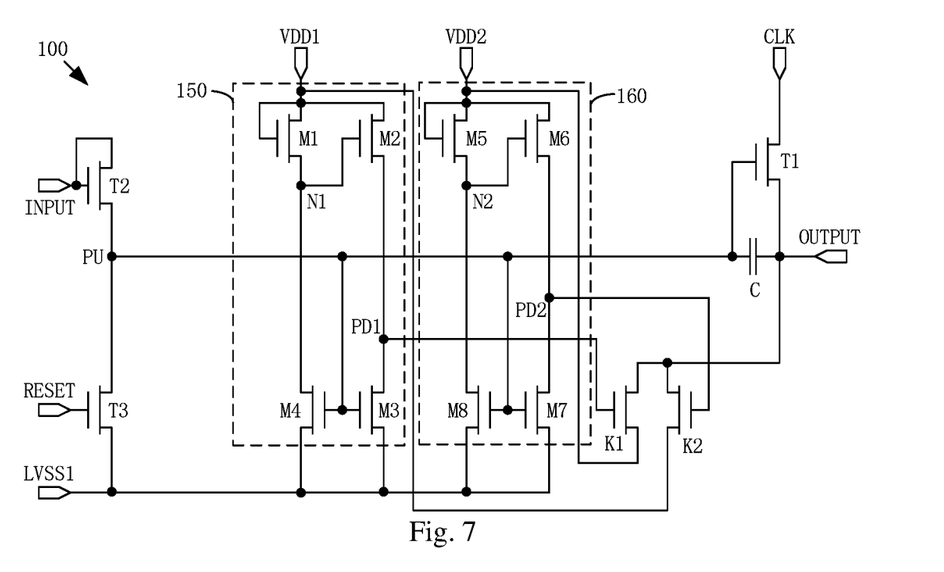
FIG. 7 is a seventh schematic diagram of a shift register provided by an embodiment of the present disclosure.

For example, as shown in FIG. 7, the shift register 100 provided by an embodiment of the present disclosure further comprises a second pull-down control circuit 160. Besides the first output pull-down transistor K1, the output pull-down circuit 140 further comprises a second output pull-down transistor K2. A first electrode of the second output pull-down transistor K2 is connected with the output terminal OUTPUT, a control electrode of the second output pull-down transistor K2 is connected with the second pull-down control circuit 160, and a second electrode of the second output pull-down transistor K2 is configured to receive the second power voltage VSS2; the second pull-down control circuit 160 is configured to control the turning-on and turning-off of the second output pull-down transistor K2. For another example, the second electrode of the first output pull-down transistor K1 is connected with a second power signal terminal VDD2 to receive a second power signal V2, and the second electrode of the second output pull-down transistor K2 is connected with a first power signal terminal VDD1 to receive a first power signal V1. For example, the first power signal V1 provided by the first power signal terminal VDD1 and the second power signal V2 provided by the second power signal terminal VDD2 are mutually reverse signals. That is, in a case that the first power signal V1 is a high level voltage (such as, the third power voltage VH), the second power signal V2 is the second power voltage VSS2; in a case that the first power signal V1 is the second power voltage VSS2, the second power signal V2 is a high level voltage (such as, the third power voltage VH). Because the first power signal V1 provided by the first power signal terminal VDD1 and the second power signal V2 provided by the second power signal terminal VDD2 are mutually reverse signals, at any moment, one of the first power signal V1 and the second power signal V2 is the second power voltage VSS2. Therefore, at any moment, one of the first output pull-down transistor K1 and the second output pull-down transistor K2 is configure to receive the second power voltage VSS2. For example, in FIG. 7 to FIG. 9, the second power terminal LVSS2 shown in FIGS. 1-6 is no longer separately provided, and the second power voltage VSS2 may be provided by one of the first power signal terminal VDD1 and the second power signal terminal VDD2.

Figure 8:
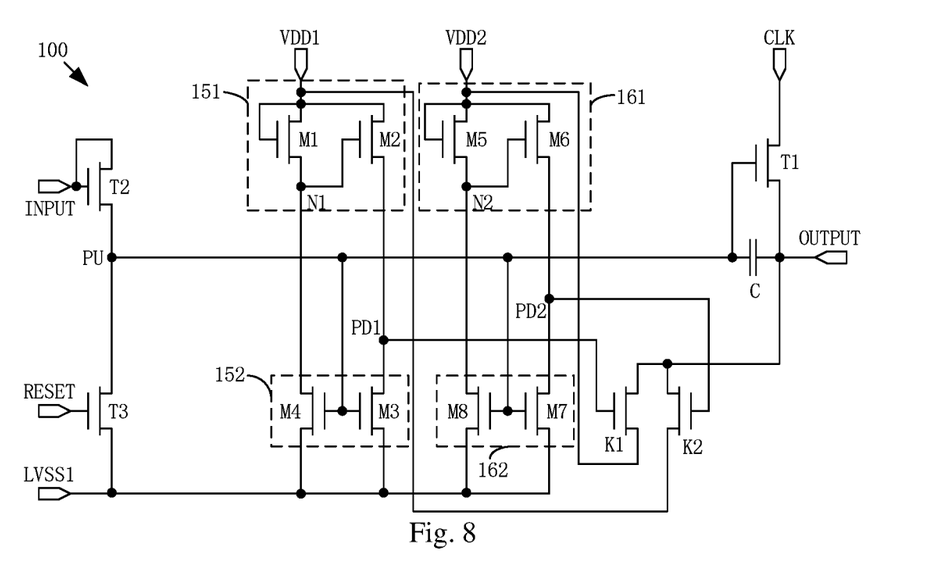
FIG. 8 is an eighth schematic diagram of a shift register provided by an embodiment of the present disclosure.

For example, as shown in FIG. 8, in the shift register 100 provided by an embodiment of the present disclosure, the first pull-down control circuit 150 comprises a first sub-control circuit 151 and a second sub-control circuit 152, and the second pull-down control circuit 160 comprises a third sub-control circuit 161 and a fourth sub-control circuit 162. The first sub-control circuit 151 is respectively connected with a first power signal terminal VDD1, a first pull-down node PD1 and the second sub-control circuit 152. The second sub-control circuit 152 is respectively connected with the pull-up node PU, the first pull-down node PD1 and the first power terminal LVSS1. The third sub-control circuit 161 is respectively connected with a second power signal terminal VDD2, a second pull-down node PD2 and the fourth sub-control circuit 162. The fourth sub-control circuit 162 is respectively connected with the pull-up node PU, the second pull-down node PD2 and the first power terminal LVSS1.

For example, the third sub-control circuit 161 and the fourth sub-control circuit 162 may cooperate with each other to adjust the voltage of the second pull-down node PD2, so as to control the turning-on and turning-off of the second output pull-down transistor K2.

For example, referring to FIG. 8, in the shift register 100 provided by an embodiment of the present disclosure, the first sub-control circuit 151 comprises a first control transistor M1 and a second control transistor M2; the second sub-control circuit 152 comprises a third control transistor M3 and a fourth control transistor M4; the third sub-control circuit 161 comprises a fifth control transistor M5 and a sixth control transistor M6; and the fourth sub-control circuit 162 comprises a seventh control transistor M7 and an eighth control transistor M8. The control electrode of the first output pull-down transistor K1 is connected with the first pull-down node PD1, and the second electrode of the first output pull-down transistor K1 is connected with the second power signal terminal VDD2 to receive the second power signal V2. A first electrode of the first control transistor M1 is connected with the first power signal terminal VDD1 to receive the first power signal V1, a control electrode of the first control transistor M1 is connected with the first power signal terminal VDD1 to receive the first power signal V1, and a second electrode of the first control transistor M1 is connected with a first node N1. A first electrode of the second control transistor M2 is connected with the first power signal terminal VDD1 to receive the first power signal V1, a control electrode of the second control transistor M2 is connected with the first node N1, and a second electrode of the second control transistor M2 is connected with a first pull-down node PD1. A first electrode of the third control transistor M3 is connected with the first pull-down node PD1, a control electrode of the third control transistor M3 is connected with the pull-up node PU, and a second electrode of the third control transistor M3 is connected with the first power terminal LVSS1 to receive the first power voltage VSS1. A first electrode of the fourth control transistor M4 is connected with the first node N1, a control electrode of the fourth control transistor M4 is connected with the pull-up node PU, and a second electrode of the fourth control transistor M4 is connected with the first power terminal LVSS1 to receive the first power voltage VSS1. The control electrode of the second output pull-down transistor K2 is connected with the second pull-down node PD2, and the second electrode of the second output pull-down transistor K2 is connected with the first power signal terminal VDD1 to receive the first power signal V1. A first electrode of the fifth control transistor M5 is connected with the second power signal terminal VDD2 to receive the second power signal V2, a control electrode of the fifth control transistor M5 is connected with the second power signal terminal VDD2 to receive the second power signal V2, and a second electrode of the fifth control transistor M5 is connected with a second node N2. A first electrode of the sixth control transistor M6 is connected with the second power signal terminal VDD2 to receive the second power signal V2, a control electrode of the sixth control transistor M6 is connected with the second node N2, and a second electrode of the sixth control transistor M6 is connected with the second pull-down node PD2. A first electrode of the seventh control transistor M7 is connected with the second pull-down node PD2, a control electrode of the seventh control transistor M7 is connected with the pull-up node PU, and a second electrode of the seventh control transistor M7 is connected with the first power terminal LVSS1 to receive the first power voltage VSS1. A first electrode of the eighth control transistor M8 is connected with the second node N2, a control electrode of the eighth control transistor M8 is connected with the pull-up node PU, and a second electrode of the eighth control transistor M8 is connected with the first power terminal LVSS1 to receive the first power voltage VSS1. The first power signal V1 and the second power signal V2 are mutually reverse signals. In a case that the first power signal V1 is a low level signal (in this case, the second power signal V2 is a high level signal), a voltage provided by the first power signal V1 is the second power voltage VSS2; however, in a case that the second power signal V2 is a low level signal (in this case, the first power signal V1 is a high level signal), a voltage provided by the second power signal V2 is the second power voltage VSS2.

Figure 9:
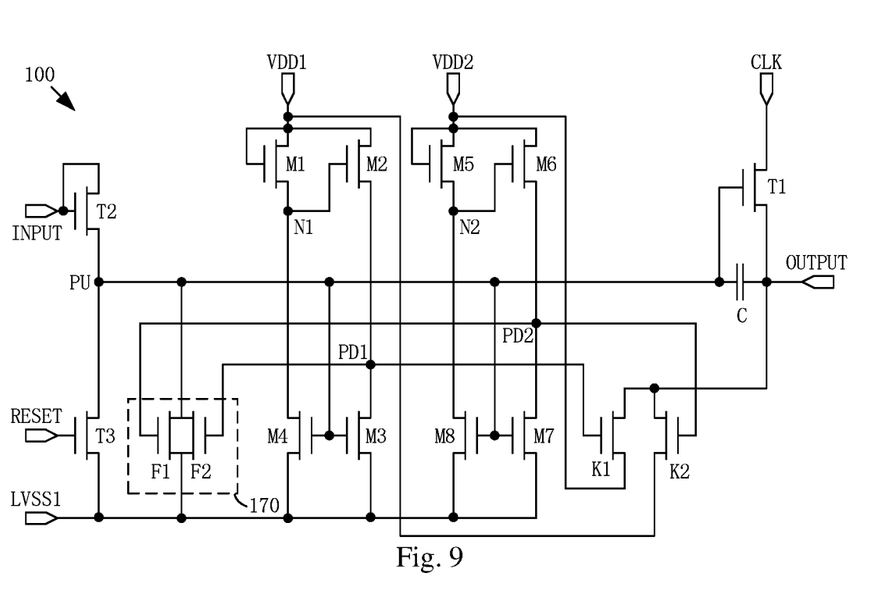
FIG. 9 is a ninth schematic diagram of a shift register provided by an embodiment of the present disclosure.

For example, as shown in FIG. 9, the shift register 100 provided by an embodiment of the present disclosure further comprises a pull-up node pull-down circuit 170. The pull-up node pull-down circuit 170 is respectively connected with the pull-up node PU, the first pull-down node PD1, the second pull-down node PD2 and the first power terminal LVSS1.

For example, as shown in FIG. 9, in the shift register 100 provided by an embodiment of the present disclosure, the pull-up node pull-down circuit 170 comprises a first pull-down transistor F1 and a second pull-down transistor F2. A first electrode of the first pull-down transistor F1 is connected with the pull-up node PU, a control electrode of the first pull-down transistor F1 is connected with the second pull-down node PD2, and a second electrode of the first pull-down transistor F1 is connected with the first power terminal LVSS1 to receive the first power voltage VSS1. A first electrode of the second pull-down transistor F2 is connected with the pull-up node PU, a control electrode of the second pull-down transistor F2 is connected with the first pull-down node PD1, and a second electrode of the second pull-down transistor F2 is connected with the first power terminal LVSS1 to receive the first power voltage VSS1.

Figure 10:
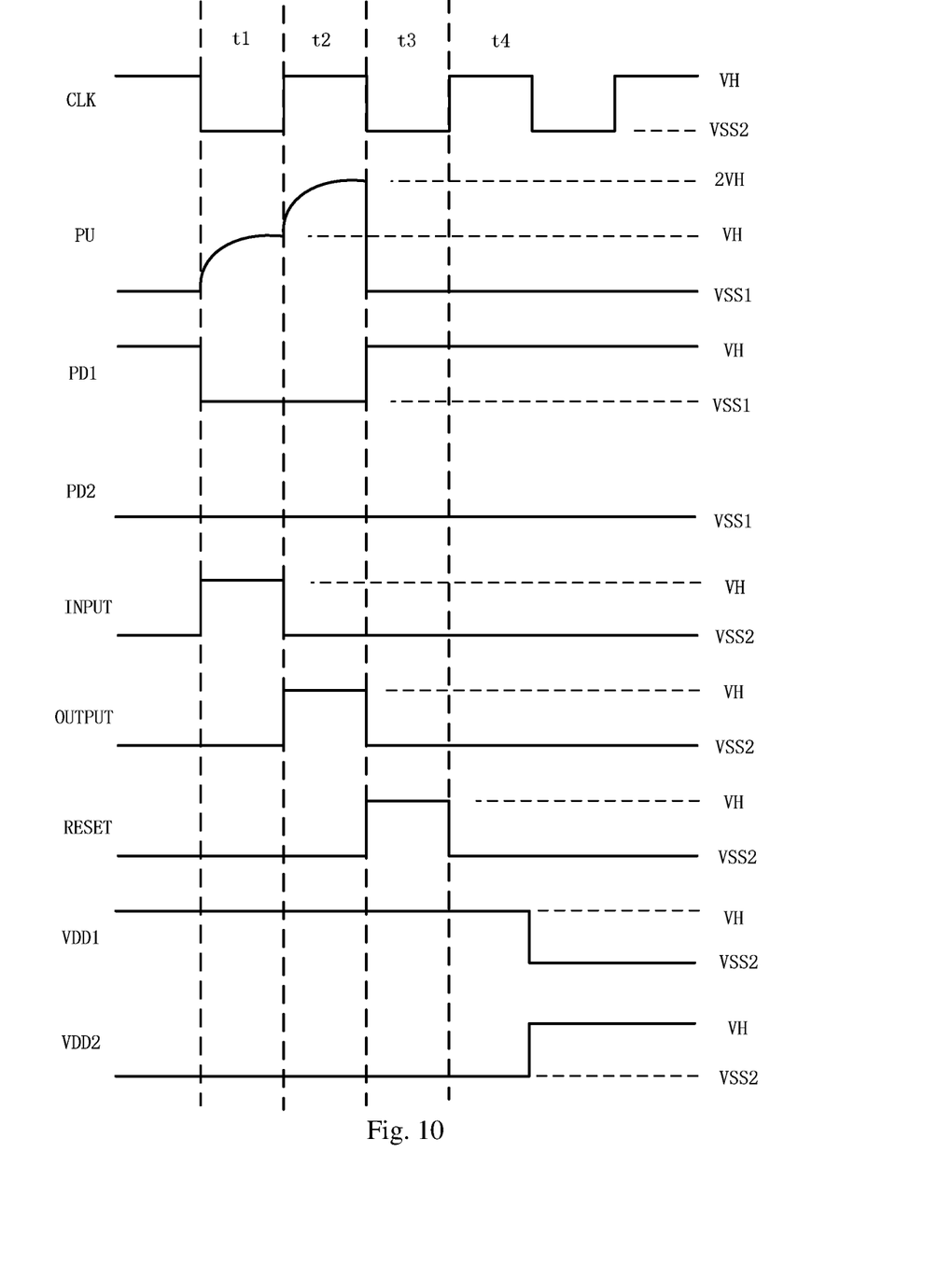
FIG. 10 is a driving timing diagram of a shift register provided by an embodiment of the present disclosure.

For example, FIG. 10 is a driving timing diagram of a shift register provided by an embodiment of the present disclosure, and the shift register shown in FIG. 9 and the driving timing shown in FIG. 10 are taken as an example to describe a working process of the shift register below.

For example, in the driving timing shown in FIG. 10, a voltage of the first power signal terminal VDD1 is the third power voltage VH (such as the voltage provided by the third power terminal VGH), and a voltage of the second power signal terminal VDD2 is the second power voltage VSS2.

For example, the third power voltage VH provided by the third power terminal VGH is larger than the second power voltage VSS2, and the second power voltage VSS2 is larger than the first power voltage VSS1. For another example, the third power voltage VH is 22V, the second power voltage VSS2 is −8V, and the first power voltage VSS1 is −11V. The embodiment of the present disclosure comprises but is not limited to a case where the third power voltage VH is 22V, the second power voltage VSS2 is −8V, and the first power voltage VSS1 is −11V. The third power voltage VH, the second power voltage VSS2, and the first power voltage VSS1 may also be other voltage values, and for example, the third power voltage VH is 10V, the second power voltage VSS2 is −5V, and the first power voltage is −8V.

For example, at a first stage t1, a voltage of the clock signal terminal CLK is the second power voltage VSS2, a voltage of the input signal terminal INPUT is the third power voltage VH, and a voltage of the reset signal terminal RESET is the second power voltage VSS2. Because the voltage of the input signal terminal INPUT is the third power voltage VH, the second transistor T2 is turned on, a voltage of the pull-up node PU is a first high level voltage (the first high level voltage, for example, is equal to the third power voltage VH), and the storage capacitor C is charged; the third control transistor M3 is turned on, so as to transmit the first power voltage VSS1 provided by the first power terminal LVSS1 to the first pull-down node PD1, the first output pull-down transistor K1 and the second pull-down transistor F2 are both turned off; and the seventh control transistor M7 is turned on, so as to transmit the first power voltage VSS1 provided by the first power terminal LVSS1 to the second pull-down node PD2, and the second output pull-down transistor K2 and the first pull-down transistor F1 are both turned off.

For example, at a second stage t2, the voltage of the clock signal terminal CLK is the third power voltage VH, the voltage of the input signal terminal INPUT is the second power voltage VSS2, and the voltage of the reset signal terminal RESET is the second power voltage VSS2. Due to the bootstrap effect of the storage capacitor C, when the voltage of the clock signal terminal CLK changes to the third power voltage VH, the storage capacitor C raises the voltage of the pull-up node PU to a second high level voltage (the second high level voltage, for example, is equal to twice of the third power voltage VH), the second high level voltage is higher than the first high level voltage, so that the first transistor T1 is fully turned on, and the first transistor T1 transmits a high level voltage of the clock signal terminal CLK to the output terminal OUTPUT.

For example, at a third stage t3, the voltage of the clock signal terminal CLK is the second power voltage VSS2, the voltage of the input signal terminal INPUT is the second power voltage VSS2, and the voltage of the reset signal terminal RESET is the third power voltage VH. Because the voltage of the reset signal terminal RESET is the third power voltage VH, the third transistor T3 is turned on, so as to transmit the first power voltage VSS1 provided by the first power terminal LVSS1 to the pull-up node PU; the third control transistor M3 and the seventh control transistor M7 are turned off, the second control transistor M2 transmits the third power voltage VH provided by the first power signal terminal VDD1 to the first pull-down node PD1; the second pull-down transistor F2 is turned on to transmit the first power voltage VSS1 to the pull-up node PU; and the first output pull-down transistor K1 is turned on to transmit the second power voltage VSS2 provided by the second power signal terminal VDD2 to the output terminal OUTPUT.

For example, at a fourth stage t4, the voltage of the input signal terminal INPUT is the second power voltage VSS2, and the voltage of the reset signal terminal RESET is the second power voltage VSS2. The pull-up node PU, the first pull-down node PD1, the second pull-down node PD2 and the output terminal OUTPUT maintain same states as those at the third stage t3.

For example, at the third stage t3 and the fourth stage t4, a gate voltage of the first transistor T1 is the first power voltage VSS1 (such as, −11V), a drain voltage of the first transistor T1 is the second power voltage VSS2 (such as, −8V). In this case, a gate-drain voltage Vgd of the first transistor T1 is Vgd=VSS1−VSS2 (for example, Vgd=−3V), and compared with a case where the gate voltage and the drain voltage are the same (that is, Vgd=0V), a channel at a drain side of the first transistor T1 is more difficult to form a sensing channel that makes the first transistor T1 be in a pinch-off state. Thus, a risk of the shift register failure due to the drift of the threshold voltage Vth of the first transistor T1 is reduced and design redundancy of the threshold voltage drift of the first transistor is increased.

It should be noted that, the gate-drain voltage of the first transistor T1 is not limited to the case of −3V, and a value of the gate-drain voltage can be flexibly selected according to a specific design of a circuit.

For example, the voltage of the first power signal terminal VDD1 and the voltage of the second power signal terminal VDD2 can be exchanged with each other at a stage in which one frame of display images is changed to another frame of display images. For example, the voltage of the first power signal terminal VDD1 after being exchanged is the second power voltage VSS2, the voltage of the second power signal terminal VDD2 after being exchanged is the third power voltage VH. For another example, as shown in FIG. 10, the voltage of the first power signal terminal VDD1 and the voltage of the second power signal terminal VDD2 can be exchanged to each other at a certain time of the fourth stage.

For example, when the voltage of the first power signal terminal VDD1 is the second power voltage VSS2, and the voltage of the second power signal terminal VDD2 is the third power voltage VH, functions of the first pull-down node PD1 and the second pull-down node PD2 are interchanged, functions of the first pull-down control circuit 150 and the second pull-down control circuit 160 are interchanged, functions of the first output pull-down transistor K1 and the second output pull-down transistor K2 are interchanged, and functions of the first pull-down transistor F1 and the second pull-down transistor F2 are interchanged. An operation principle of the shift register thereof is similar to a case that the voltage of the first power signal terminal VDD1 is the third power voltage VH and the voltage of the second power signal terminal VDD2 is the second power voltage VSS2, and details are not repeated here.

For example, the first pull-down control circuit 150 and the second pull-down control circuit 160 can control the first pull-down node PD1 and the second pull-down node PD2 to operate separately. In this way, the first output pull-down transistor K1 and the second output pull-down transistor K2 can be operated in a time-sharing manner, and the first pull-down transistor F1 and the second pull-down transistor F2 can be operated in a time-sharing manner, so as to reduce the possibility of malfunction caused when the transistors are turned on for a long time, improve the anti-interference ability of the shift register, and further improve the reliability of the shift register.

For example, by utilizing a characteristic that the voltage of the first power signal terminal VDD1 and the voltage of the second power signal terminal VDD2 are mutually reverse signals, the second power voltages VSS2 provided by the first power signal terminal VDD1 and the second power signal terminal VDD2 are transmitted to the output terminal in a time-division manner, so as to distinguish the second power voltage VSS2 of the output terminal from the first power voltage VSS1 of the pull-up node. Thus, a certain voltage difference exists between the control electrode and the second electrode of the first transistor, so as to increase the design redundancy of the threshold voltage drift of the first transistor.

Figure 11:
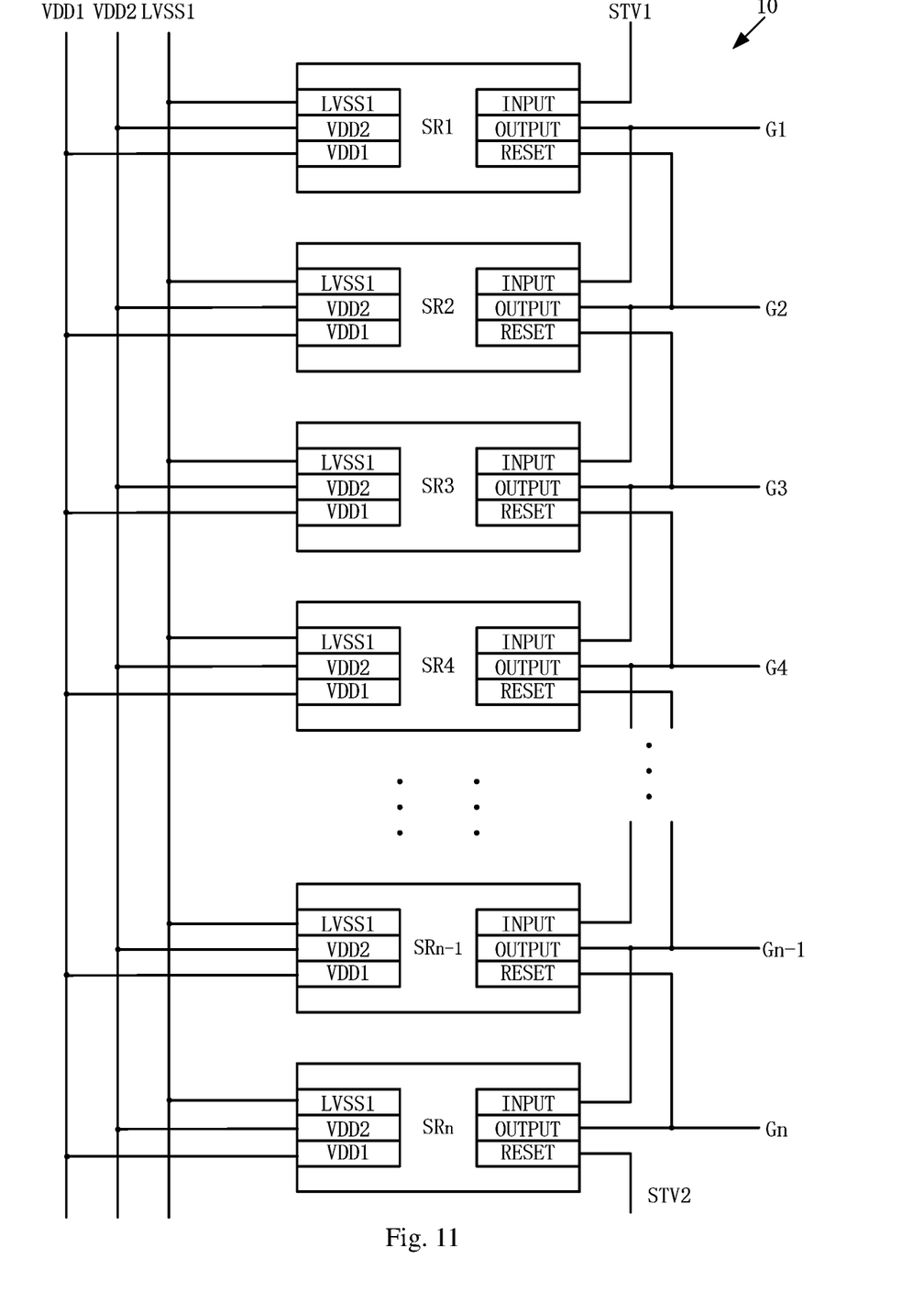
FIG. 11 is a schematic diagram of a gate driving circuit provided by an embodiment of the present disclosure.

An embodiment of the present disclosure further comprises a gate driving circuit 10. As shown in FIG. 11, the gate driving circuit 10 comprises the shift register 100 provided by any one embodiment of the present disclosure.

For example, as shown in FIG. 11, the gate driving circuit 10 provided by an embodiment of the present disclosure comprises a plurality of cascaded shift registers 100 provided by any one embodiment of the present disclosure. Except for a first-stage shift register 100 and a last-stage shift register 100, an input signal terminal INPUT of a present-stage shift register 100 is connected with an output terminal OUTPUT of a previous-stage shift register 100; and a reset signal terminal RESET of the present-stage shift register 100 is connected with an output terminal OUTPUT of a next-stage shift register 100.

For example, an input signal terminal INPUT of the first-stage shift register is connected with a first trigger signal terminal STV1; and a reset signal terminal RESET of the last-stage shift register is connected with a second trigger signal terminal STV2.

For example, when the gate driving circuit 10 performs forward scanning, the first trigger signal terminal STV1 provides an input signal to the first-stage shift register, and the second trigger signal terminal STV2 provides a reset signal to the last-stage shift register. When the gate driving circuit 10 performs backward scanning, the second trigger signal terminal STV2 provides an input signal to the last-stage shift register, and the first trigger signal terminal STV1 provides a reset signal to the first-stage shift register. For example, functions of the input circuit and the reset circuit of the shift register are interchanged when switching between the forward scanning and the backward scanning.

For example, as shown in FIG. 11, the gate driving circuit 10 comprises shift registers SR1, SR2, . . . , SRn with n stages. Each of the shift registers SR1, SR2, . . . , SRn may be the shift register 100 provided by any one embodiment of the present disclosure. Output terminals OUTPUT of the shift registers SR1, SR2, . . . , SRn are respectively connected with gate lines G1, G2, . . . , Gn.

It should be noted that, the gate diving circuit 10 provided by the embodiments of the present disclosure can achieve the forward scanning and the backward scanning. When a scanning direction is switched, a "previous stage" and "next stage" in the time sequence change correspondingly. Therefore, the above "previous stage" and "next stage" do not refer to the previous stage and the next stage in the scanning sequence, but refer to the previous stage and the next stage in the physical connection.

Figure 12:
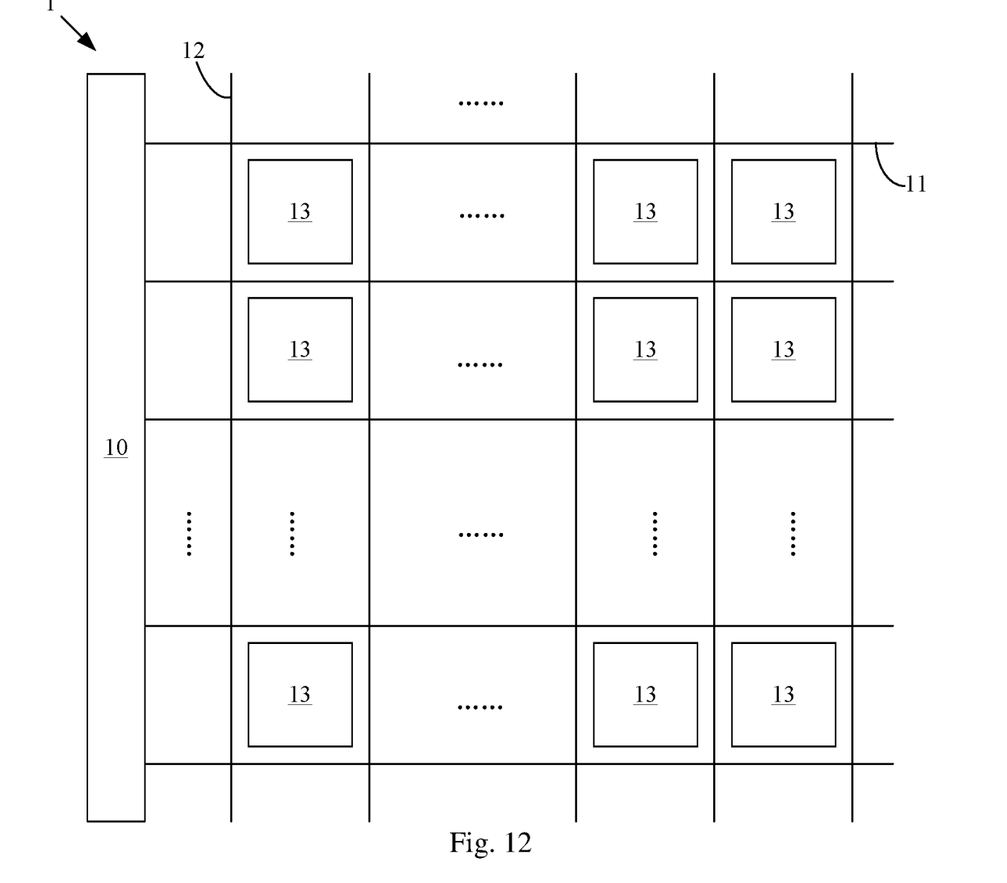
FIG. 12 is a schematic diagram of a display panel provided by an embodiment of the present disclosure.

An embodiment of the present disclosure further provides a display panel 1. As shown in FIG. 12, the display panel 1 comprises the gate driving circuit 10 provided by any one embodiment of the present disclosure.

For example, as shown in FIG. 12, the display panel 1 provided by the embodiments of the present disclosure further comprises gate lines 11, data lines 12 and a plurality of pixel units 13 defined by intercrossing of the gate lines 11 and the data lines 12, and the gate driving circuit 10 is configured to provide gate driving signals to the gate lines 11.

For example, the gate lines 11 may comprise gate lines G1, G2, . . . , Gn, and a shift register in each stage from the shift registers SR1, SR2, . . . , SRn is configured to output a gate driving signal to a corresponding gate line in the gate lines G1, G2, . . . , Gn.

Figure 13:
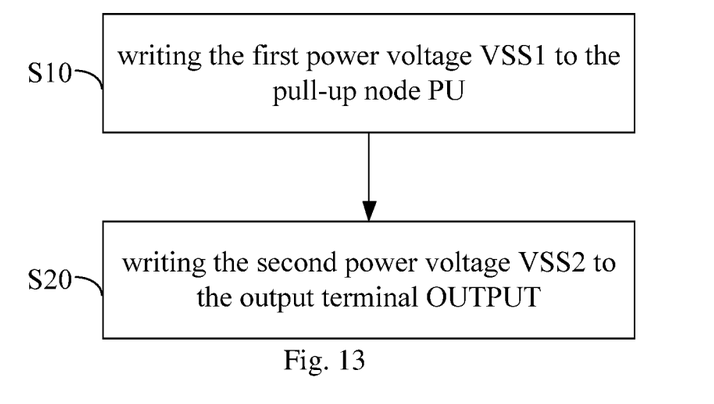
FIG. 13 is a flow chart of a driving method of a shift register provided by an embodiment of the present disclosure.

An embodiment of the present disclosure further provides a driving method of a shift register 100 provided by anyone embodiment of the present disclosure. As shown in FIG. 13, the driving method comprises the following steps:

Step S10: writing the first power voltage VSS1 to the pull-up node PU;

Step S20: writing the second power voltage VSS2 to the output terminal OUTPUT, the first power voltage VSS1 being different from the second power voltage VSS2.

For example, in a case that the first transistor T1 is an N-type transistor, the first power voltage VSS1 is smaller than the second power voltage VSS2.

For example, in a case that the first transistor T1 is a P-type transistor, the first power voltage VSS1 is larger than the second power voltage VSS2.

For example, the shift register, the gate driving circuit, the display panel and the driving method provided by the embodiments of the present disclosure can improve circuit stability.

Although detailed description has been given above to the present disclosure with general description and embodiments, it shall be apparent to those skilled in the art that some modifications or improvements may be made on the basis of the embodiments of the present disclosure. Therefore, all the modifications or improvements made without departing from the spirit of the present disclosure shall all fall within the scope of protection of the present disclosure.

The present application claims priority to Chinese patent application No. 201710135056.1, filed Mar. 8, 2017, the entire disclosure of which is incorporated herein by reference as part of the present application.

What is claimed is:

1. A shift register, comprising:
    an input circuit, connected with a pull-up node and an input signal terminal;
    a reset circuit, connected with the pull-up node, a reset signal terminal, and a first power terminal to receive a first power voltage;
    an output circuit, connected with the pull-up node, a clock signal terminal, and an output terminal;
    an output pull-down circuit, connected with the output terminal and configured to write a second power voltage to the output terminal, wherein the first power voltage is different from the second power voltage; and
    a first pull-down control circuit, wherein:
        the output pull-down circuit comprises a first output pull-down transistor;
        a first electrode of the first output pull-down transistor is connected with the output terminal, a control electrode of the first output pull-down transistor is connected with the first pull-down control circuit, a second electrode of the first output pull-down transistor is configured to receive the second power voltage; and
        the first pull-down control circuit is configured to control turning-on and turning-off of the first output pull-down transistor,
    wherein the shift register further comprises a second pull-down control circuit, wherein:
        the output pull-down circuit further comprises a second output pull-down transistor;
        a first electrode of the second output pull-down transistor is connected with the output terminal, a control electrode of the second output pull-down transistor is connected with the second pull-down control circuit, a second electrode of the second output pull-down transistor is configured to receive the second power voltage; and
        the second pull-down control circuit is configured to control turning-on and turning-off of the second output pull-down transistor,
    wherein:
        the first pull-down control circuit comprises a first sub-control circuit and a second sub-control circuit, and the second pull-down control circuit comprises a third sub-control circuit and a fourth sub-control circuit;
        the first sub-control circuit is connected with a first power signal terminal, a first pull-down node, and the second sub-control circuit;
        the second sub-control circuit is connected with the pull-up node, the first pull-down node, and the first power terminal;
        the third sub-control circuit is connected with a second power signal terminal, a second pull-down node, and the fourth sub-control circuit; and
        the fourth sub-control circuit is connected with the pull-up node, the second pull-down node, and the first power terminal,
    wherein:
        the first sub-control circuit comprises a first control transistor and a second control transistor, the second sub-control circuit comprises a third control transistor and a fourth control transistor, the third sub-control circuit comprises a fifth control transistor and a sixth control transistor, and the fourth sub-control circuit comprises a seventh control transistor and an eighth control transistor;
        the control electrode of the first output pull-down transistor is connected with the first pull-down node, and the second electrode of the first output pull-down transistor is connected with the second power signal terminal to receive a second power signal;
        a first electrode of the first control transistor is connected with the first power signal terminal to receive a first power signal, a control electrode of the first control transistor is connected with the first power signal terminal to receive the first power signal, and a second electrode of the first control transistor is connected with a first node;

a first electrode of the second control transistor is connected with the first power signal terminal to receive the first power signal, a control electrode of the second control transistor is connected with the first node, and a second electrode of the second control transistor is connected with the first pull-down node;

a first electrode of the third control transistor is connected with the first pull-down node, a control electrode of the third control transistor is connected with the pull-up node, and a second electrode of the third control transistor is connected with the first power terminal to receive the first power voltage;

a first electrode of the fourth control transistor is connected with the first node, a control electrode of the fourth control transistor is connected with the pull-up node, and a second electrode of the fourth control transistor is connected with the first power terminal to receive the first power voltage;

the control electrode of the second output pull-down transistor is connected with the second pull-down node, and the second electrode of the second output pull-down transistor is connected with the first power signal terminal to receive the first power signal;

a first electrode of the fifth control transistor is connected with the second power signal terminal to receive the second power signal, a control electrode of the fifth control transistor is connected with the second power signal terminal to receive the second power signal, and a second electrode of the fifth control transistor is connected with a second node;

a first electrode of the sixth control transistor is connected with the second power signal terminal to receive the second power signal, a control electrode of the sixth control transistor is connected with the second node, and a second electrode of the sixth control transistor is connected with the second pull-down node;

a first electrode of the seventh control transistor is connected with the second pull-down node, a control electrode of the seventh control transistor is connected with the pull-up node, and a second electrode of the seventh control transistor is connected with the first power terminal to receive the first power voltage;

a first electrode of the eighth control transistor is connected with the second node, a control electrode of the eighth control transistor is connected with the pull-up node, and a second electrode of the eighth control transistor is connected with the first power terminal to receive the first power voltage; and the first power signal and the second power signal are mutually reverse signals, when the first power signal is a low-level signal, a voltage of the first power signal is the second power voltage, and when the second power signal is the low-level signal, a voltage of the second power signal is the second power voltage.

2. The shift register according to claim 1, wherein:

the output circuit comprises a storage capacitor and a first transistor, a first electrode of the first transistor is connected with the clock signal terminal, a control electrode of the first transistor is connected with the pull-up node, a second electrode of the first transistor is connected with the output terminal, a first terminal of the storage capacitor is connected with the pull-up node, and a second terminal of the storage capacitor is connected with the output terminal;

the input circuit comprises a second transistor, a first electrode of the second transistor is connected with the input signal terminal, a control electrode of the second transistor is connected with the input signal terminal, a second electrode of the second transistor is connected with the pull-up node; and the reset circuit comprises a third transistor, a first electrode of the third transistor is connected with the pull-up node, a control electrode of the third transistor is connected with the reset signal terminal, and a second electrode of the third transistor is connected with the first power terminal.

3. The shift register according to claim 1, further comprising a pull-up node pull-down circuit, connected with the pull-up node, the first pull-down node, the second pull-down node, and the first power terminal.

4. The shift register according to claim 3, wherein:

the pull-up node pull-down circuit comprises a first pull-down transistor and a second pull-down transistor, a first electrode of the first pull-down transistor is connected with the pull-up node, a control electrode of the first pull-down transistor is connected with the second pull-down node, and a second electrode of the first pull-down transistor is connected with the first power terminal to receive the first power voltage; and a first electrode of the second pull-down transistor is connected with the pull-up node, a control electrode of the second pull-down transistor is connected with the first pull-down node, and a second electrode of the second pull-down transistor is connected with the first power terminal to receive the first power voltage.

5. A gate driving circuit, comprising the shift register according to claim 1.

6. The gate driving circuit according to claim 5, wherein except for a first-stage shift register and a last-stage shift register, an input signal terminal of a present-stage shift register is connected with an output terminal of a previous-stage shift register, and a reset signal terminal of the present-stage shift register is connected with an output terminal of a next-stage shift register.

7. A display panel, comprising the gate driving circuit according to claim 5.

8. A driving method of the shift register according to claim 1, comprising:

writing the first power voltage to the pull-up node; and writing the second power voltage to the output terminal, wherein the first power voltage is different from the second power voltage.

* * * * *